United States Patent
Jhang et al.

(10) Patent No.: US 11,629,271 B2
(45) Date of Patent: Apr. 18, 2023

(54) TITANIUM DIOXIDE CONTAINING RUTHENIUM CHEMICAL MECHANICAL POLISHING SLURRY

(71) Applicant: CMC Materials, Inc., Aurora, IL (US)

(72) Inventors: Jin-Hao Jhang, Taichung (TW); Cheng-Yuan Ko, New Taipei (TW)

(73) Assignee: CMC Materials, Inc., Aurora, IL (US)

(*) Notice: Subject to any disclaimer, the term of this patent is extended or adjusted under 35 U.S.C. 154(b) by 16 days.

(21) Appl. No.: 17/391,674

(22) Filed: Aug. 2, 2021

(65) Prior Publication Data

US 2022/0033683 A1    Feb. 3, 2022

Related U.S. Application Data

(60) Provisional application No. 63/060,262, filed on Aug. 3, 2020.

(51) Int. Cl.
  *C09G 1/02*       (2006.01)
  *H01L 21/321*   (2006.01)
  *C09K 13/00*    (2006.01)

(52) U.S. Cl.
  CPC ............ *C09G 1/02* (2013.01); *C09K 13/00* (2013.01); *H01L 21/3212* (2013.01)

(58) Field of Classification Search
  None
  See application file for complete search history.

(56) References Cited

U.S. PATENT DOCUMENTS

| | | | |
|---|---|---|---|
| 7,803,711 B2 | 9/2010 | White et al. | |
| 2009/0075566 A1* | 3/2009 | White | B24B 37/044 |
| | | | 451/37 |
| 2017/0096584 A1* | 4/2017 | Nojima | C09G 1/02 |

FOREIGN PATENT DOCUMENTS

| | | |
|---|---|---|
| WO | 2019015144 A1 | 1/2019 |
| WO | 2019151145 A1 | 8/2019 |

OTHER PUBLICATIONS

Cheng et al., Surface characteristics of ruthenium in periodate-based slurry during chemical mechanical polishing, Applied Surface Science, 351, 2015, p. 401-409.
Cui et al., Environmentally clean slurry using nano-TiO abrasive mixed with oxidizer H2O2 for ruthenium-film chemical mechanical planarization, Applied Surface Science, 282, 2013, 844-850.

* cited by examiner

*Primary Examiner* — Roberts P Culbert
(74) *Attorney, Agent, or Firm* — Thomas Omholt; Erika R. Singleton

(57) ABSTRACT

A chemical mechanical polishing composition for polishing a ruthenium containing substrate comprises, consists of, or consists essentially of a water based liquid carrier; titanium oxide particles dispersed in the liquid carrier, the titanium oxide particles including rutile and anatase such that an x-ray diffraction pattern of the titanium oxide particles has a ratio X:Y greater than about 0.05, wherein X represents an intensity of a peak in the x-ray diffraction pattern having a d-spacing of about 3.24 Å and Y represents an intensity of a peak in the x-ray diffraction pattern having a d-spacing of about 3.51 Å; and a pH in a range from about 7 to about 10. Optional embodiments further include a pH buffer having a $pK_a$ in a range from about 6 to about 9.

21 Claims, 1 Drawing Sheet

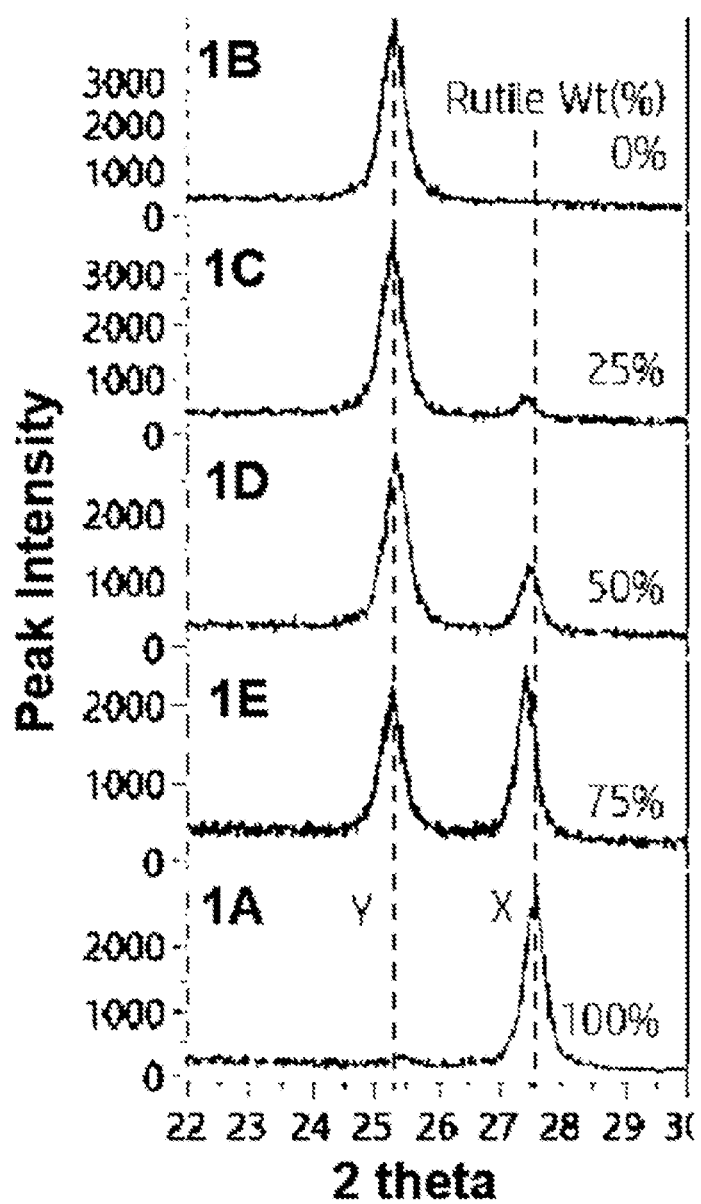

TITANIUM DIOXIDE CONTAINING RUTHENIUM CHEMICAL MECHANICAL POLISHING SLURRY

CROSS-REFERENCE TO RELATED APPLICATIONS

None.

FIELD OF THE INVENTION

The disclosed embodiments relate to chemical mechanical polishing of metal layers and more particularly relate to titanium dioxide containing chemical mechanical polishing compositions for polishing ruthenium layers.

BACKGROUND OF THE INVENTION

A number of chemical-mechanical polishing (CMP) operations are used in both front-end-of-the-line (FEOL) and back-end-of-the-line (BEOL) processing of semiconductor devices. For example, shallow trench isolation (STI) is an FEOL process used prior to formation of the transistors to form a pattern of inlaid tetraethyl orthosilicate (TEOS) in the silicon wafer. Tungsten plug and interconnect and copper interconnect and dual damascene processes are BEOL processes used to form the network of metal wires that connect the device transistors. In these processes metal layers are deposited in openings formed in a dielectric material (e.g., TEOS). CMP is used to remove the excess metal from the dielectric and thereby form conductive plugs and/or interconnects therein.

As transistor sizes continue to shrink, the use of conventional interconnect technology has become increasingly challenging. Recently, ruthenium (Ru) has emerged as a potential candidate to replace the tantalum/tantalum nitride barrier stack in copper interconnects. Ruthenium is also being actively investigated as an electrode material in advanced capacitor application for next generation memory devices. With the potential introduction of ruthenium into semiconductor integrated circuit devices, there is an emerging need for CMP slurries that are able to planarize ruthenium containing substrates.

In general, commercially available CMP slurries fabricated for removing tungsten, copper, or other metal layers are ill-equipped for polishing ruthenium, particularly in advanced node devices. For example, Ru tends to be a hard metal with little chemical activity. Achieving suitable removal rates of Ru can therefore be challenging. Moreover the formation of insoluble ruthenium oxide products is known to cause pad staining and increased defectivity. There is a need for CMP slurries that can remove ruthenium films at acceptably high rates without pad staining.

BRIEF SUMMARY OF THE INVENTION

A first chemical mechanical polishing composition comprises, consists of, or consists essentially of a water based liquid carrier; titanium oxide particles dispersed in the liquid carrier, the titanium oxide particles including rutile and anatase such that an x-ray diffraction pattern of the titanium oxide particles has a ratio X:Y of about 0.05 to about 0.5, wherein X represents an intensity of a peak in the x-ray diffraction pattern having a d-spacing of about 3.24 Å and Y represents an intensity of a peak in the x-ray diffraction pattern having a d-spacing of about 3.51 Å; and a pH in a range from about 7 to about 10.

A second chemical mechanical polishing composition comprises, consists of, or consists essentially of a water based liquid carrier; titanium oxide particles dispersed in the liquid carrier, the titanium oxide particles including rutile and anatase such that an x-ray diffraction pattern of the titanium oxide particles has a ratio X:Y of greater than about 0.05, wherein X represents an intensity of a peak in the x-ray diffraction pattern having a d-spacing of about 3.24 Å and Y represents an intensity of a peak in the x-ray diffraction pattern having a d-spacing of about 3.51 Å; a pH in a range from about 7 to about 10; and a pH buffer having a $pK_a$ in a range from about 6 to about 9.

Methods for polishing substrates including at least one ruthenium layer are further disclosed.

BRIEF DESCRIPTION OF THE DRAWING

For a more complete understanding of the disclosed subject matter, and advantages thereof, reference is now made to the following description taken in conjunction with the accompanying drawing which depicts x-ray diffraction data for example titanium oxide particles.

DETAILED DESCRIPTION OF THE INVENTION

A first chemical mechanical polishing composition comprises, consists of, or consists essentially of a water based liquid carrier; titanium oxide particles dispersed in the liquid carrier, the titanium oxide particles including rutile and anatase such that an x-ray diffraction pattern of the titanium oxide particles has a ratio X:Y of about 0.05 to about 0.5, wherein X represents an intensity of a peak in the x-ray diffraction pattern having a d-spacing of about 3.24 Å and Y represents an intensity of a peak in the x-ray diffraction pattern having a d-spacing of about 3.51 Å; and a pH in a range from about 7 to about 10.

A second chemical mechanical polishing composition comprises, consists of, or consists essentially of a water based liquid carrier; titanium oxide particles dispersed in the liquid carrier, the titanium oxide particles including rutile and anatase such that an x-ray diffraction pattern of the titanium oxide particles has a ratio X:Y of greater than about 0.05, wherein X represents an intensity of a peak in the x-ray diffraction pattern having a d-spacing of about 3.24 Å and Y represents an intensity of a peak in the x-ray diffraction pattern having a d-spacing of about 3.51 Å; a pH in a range from about 7 to about 10; and a pH buffer having a $pK_a$ in a range from about 6 to about 9.

The disclosed compositions and methods may provide various technical advantages and improvements over the prior art. For example, disclosed chemical mechanical polishing compositions provide high ruthenium polishing rates with minimal or no pad staining.

The polishing composition contains titanium oxide abrasive particles suspended in a liquid carrier. The liquid carrier is used to facilitate the application of the abrasive particles and any optional chemical additives to the surface of the substrate to be polished (e.g., planarized). The liquid carrier may be any suitable carrier (e.g., a solvent) including lower alcohols (e.g., methanol, ethanol, etc.), ethers (e.g., dioxane, tetrahydrofuran, etc.), water, and mixtures thereof. Preferably, the liquid carrier comprises, consists essentially of, or consists of water, more preferably deionized water.

In the disclosed polishing compositions the titanium oxide (titania) particles comprise, consist essentially of, or consist of titanium dioxide having a rutile structure or titanium oxide having a rutile structure and titanium dioxide having an anatase structure. Individual titania particles may comprise, consist essentially of, or consist of rutile, anatase, or a mixture of rutile and anatase.

As is known to those of skill in the art, titanium dioxide exists in at least seven polymorphs, four of which exist in nature. The three most common forms are rutile, anatase, and brookite, with the rutile and anatase forms being the forms typically obtained via synthesis. All possess the same empirical formula, $TiO_2$, but each has a different crystal structure. The rutile form ("rutile") is the most thermodynamically stable form of titanium dioxide. The crystal structure of rutile is tetragonal in which the Ti—O octahedra share four edges. The anatase form ("anatase") has a tetragonal crystal structure similar to rutile, except that the Ti—O octahedra share four corners instead of four edges. Anatase converts spontaneously into the more stable rutile at temperatures above about 915° C. The brookite form, which is the least common of the three common forms and which is rarely used commercially, has an orthorhombic crystal structure which converts spontaneously into rutile at temperatures around 750° C.

A large number of preparative methods for titanium dioxide are known in the art. Synthetic methods include vapor-phase synthesis and solution-phase synthesis. In vapor-phase synthesis of titanium dioxide, a volatilized titanium (IV) compound is mixed with water vapor and/or oxygen, and the gaseous stream is passed through a heated zone in order to hydrolyze the titanium (IV) compound and produce titanium dioxide. The thus-produced titanium dioxide is isolated by cooling the gaseous stream and collecting particulate titanium dioxide. For example, U.S. Pat. No. 4,842,832 teaches a method of synthesizing titanium dioxide wherein a volatile titanium (IV) compound, such as titanium tetrachloride or a titanium tetraalkoxide compound, is vaporized, the vapors are combined with water vapor and/or oxygen and a carrier gas, and the resulting gaseous mixture is heated in the gas phase to a temperature of 250-600° C. The vapor is then cooled to provide spherical titanium dioxide particles which can be amorphous, rutile, anatase, or a mixture thereof. U.S. Pat. No. 4,241,042 describes a method of synthesizing titanium dioxide wherein a liquid aerosol of a hydrolyzable titanium (IV) compound such as titanium tetrachloride or a titanium tetraalkoxide compound is contacted with water vapor in a carrier gas and heated, optionally in the presence of a nucleating agent. The vapor is subsequently cooled to provide spherical particles of titanium dioxide. The spherical particles can be subjected to a thermal treatment step at 250-1100° C., before or after a recovery step, which thermal treatment step increases the percentage of the spherical titanium dioxide particles which are rutile.

Solution-phase synthesis of titanium dioxide is also known in the art. Methods allowing for the preparation of titanium dioxide particles having particular rutile/anatase ratios are well known in the literature. For example, the preparation of titanium dioxide particles via precipitation from solutions of titanium (IV) salts produces mixtures of particles having rutile and anatase forms, with the proportions of rutile and anatase dependent, in part, on the particular titanium (IV) compound used as starting material, as well as on the specific reaction conditions (see, e.g., Wilska, Acta Chemica Scandinavica, 8:1796-1801 (1954)).

The phase content of the titanium dioxide (i.e., the weight ratio of rutile to anatase) can be determined via a number of techniques. One suitable technique is X-ray diffraction (XRD). Rutile and anatase exhibit X-ray diffraction patterns having distinct peaks, both individually as pure crystallites and when present together in a particular sample of titanium dioxide (either as individual particles or particles containing a mixture of rutile and anatase). The ratio of the intensity of the peaks (i.e., lines) in a mixed sample containing both rutile and anatase can be correlated to the concentrations of rutile and anatase via use of calibration curves, obtained by preparing mixtures of rutile and anatase having known amounts of each crystallite and by obtaining an x-ray diffraction thereof. Although the line intensity as a function of concentration is not equal for rutile and for anatase, the determination of the ratio of line intensity for rutile and anatase in a sample containing both is a useful approximation of the weight ratio of rutile and anatase in the sample. See, e.g., Wilska, supra., and references cited therein. Typically, the useful x-ray diffraction line characteristic of rutile has a d-spacing of about 3.24 Å, and the useful x-ray diffraction line characteristic of anatase has a d-spacing of about 3.51 Å.

Commonly assigned U.S. Pat. No. 7,803,711 claims a method of polishing a substrate using a polishing composition having a titanium oxide abrasive in which an x-ray diffraction pattern of the titanium oxide particles has an X:Y ratio of greater than 0.5 (wherein X represents an intensity of a peak in the x-ray diffraction pattern having a d-spacing of about 3.24 Å and Y represents an intensity of a peak in the x-ray diffraction pattern having a d-spacing of about 3.51 Å). The '711 patent further discloses that compositions having titanium oxide particles with a high X:Y ratio (e.g., a ratio of 3 in Example 1) polish ruthenium at high removal rates while compositions having titanium oxide particles with a low X:Y ratio (e.g., a ratio of 0.33 in Example 1) polish ruthenium at low removal rates. The '711 patent proposed a polishing mechanism in which rutile chemically reacts with ruthenium to accelerate the polishing rate.

Applicants have unexpectedly discovered that high ruthenium removal rates can be achieved using polishing compositions having a significantly lower rutile to anatase ratio than previously believed, in particular, with titanium oxide particles having an X:Y ratio of less than 0.5. For example, the X:Y ratio may be in a range from about 0.05 to about 0.5 (e.g., from about 0.05 to about 0.45). Polishing compositions including titanium oxide particles dispersed in a liquid carrier are disclosed. The titanium oxide particles include rutile and anatase such that an x-ray diffraction pattern of the titanium oxide particles has a ratio X:Y of about 0.05 to about 0.5 (e.g., from about 0.05 to about 0.45), wherein X represents an intensity of a peak in the x-ray diffraction pattern having a d-spacing of about 3.24 Å and Y represents an intensity of a peak in the x-ray diffraction pattern having a d-spacing of about 3.51 Å. The pH of the composition is from about 7 to about 10.

In alternative and/or additional embodiments, disclosed polishing compositions include titanium oxide particles dispersed in a liquid carrier. The titanium oxide particles include rutile and anatase such that an x-ray diffraction pattern of the titanium oxide particles has a ratio X:Y of greater than about 0.05 (e.g., greater than about 0.5, greater than about 1, greater than about 5, or greater than about 10), wherein X represents an intensity of a peak in the x-ray diffraction pattern having a d-spacing of about 3.24 Å and Y represents an intensity of a peak in the x-ray diffraction pattern having a d-spacing of about 3.51 Å. The pH of the composition is about 7 to about 11. The composition further includes a pH buffer having a $PK_a$ in a range from about 6 to about 9 and may optionally further include a peroxide compound such as hydrogen peroxide. In certain preferred embodiments, the titanium oxide particles may be substantially pure rutile.

The titanium oxide abrasive is desirably substantially pure titanium dioxide. However, it will be understood that minor amounts of impurities and dopants may be present in the abrasive. For example, silicon (or silicon oxide) impurities (up to a few weight percent) are well known in commercial titanium oxide. Moreover, titanium oxide is commonly prepared using dopants such as tin compounds in order to influence the ratio of rutile to anatase. Accordingly, the titanium oxide particles may contain small amounts (e.g., about 5 wt. % or less, or about 4 wt. % or less, or about 2 wt. % or less, or about 1 wt. % or less) of materials other than titanium dioxide (e.g., including silicon compounds and/or tin compounds).

The titanium oxide particles may have substantially any suitable particle size. The particle size of a particle suspended in a liquid carrier may be defined in the industry using various means. For example, the particle size may be defined as the diameter of the smallest sphere that encompasses the particle and may be measured using a number of commercially available instruments, for example, including the CPS Disc Centrifuge, Model DC24000HR (available from CPS Instruments, Prairieville, La.) or the Zetasizer® available from Malvern Instruments®. The titanium oxide particles may have an average particle size of about 10 nm or more (e.g., about 20 nm or more, about 30 nm or more, about 40 nm or more, or about 50 nm or more). The titanium oxide particles may have an average particle size of about 300 nm or less (e.g., about 250 nm or less, about 200 nm or less, about 150 nm or less, or about 125 nm or less). Accordingly, the titanium oxide particles may have an average particle size in a range bounded by any two of the above endpoints. For example, the titanium oxide particles may have an average particle size in a range from about 10 nm to about 300 nm (e.g., from about 20 nm to about 250 nm, from about 40 nm to about 200 nm, or from about 50 nm to about 150 nm).

The polishing composition may include substantially any suitable amount of the titanium oxide particles. The polishing composition may include about 0.01 wt. % or more of the titanium oxide particles at point of use (e.g., about 0.02 wt. % or more, about 0.05 wt. % or more, or about 0.1 wt. % or more). The polishing composition may also include about 5 wt. % or less of the titanium oxide particles at point of use (e.g., about 2 wt. % or less, about 1 wt. % or less, or about 0.5 wt. % or less). Accordingly, the point of use concentration of titanium oxide particles in the polishing composition may be in a range bounded by any two of the above endpoints. For example, the amount of titanium oxide particles in the polishing composition may be in a range from about 0.01 wt. % to about 5 wt. % at point of use (e.g., from about 0.02 wt. % to about 2 wt. %, from about 0.05 wt. % to about 1 wt. %, or from about 0.1 wt. % to about 0.5 wt. %).

The polishing composition is generally alkaline, having a pH greater than about 7. The polishing composition preferably has a pH in a range from about 7 to about 11 (e.g., about 7 to about 10, about 7.5 to about 10, about 7.5 to about 9.5, or about 8 to about 9). It will be understood that the pH of the polishing composition may be achieved and/or maintained by any suitable means (depending of course on the desired pH). The polishing composition may include substantially any suitable pH adjusting agents or buffering systems. For example, suitable pH adjusting agents may include nitric acid, sulfuric acid, phosphoric acid, phthalic acid, citric acid, adipic acid, oxalic acid, malonic acid, maleic acid, ammonium hydroxide, potassium hydroxide, tetraethyl ammonium hydroxide, tetrabutyl ammonium hydroxide, and the like while suitable buffering agents may include phosphates, sulfates, acetates, malonates, oxalates, borates, ammonium salts, propionates, mixtures thereof, and the like.

In certain preferred embodiments, the polishing composition may further include a pH buffer having a $pK_a$ in a range from about 6 to about 9 (e.g., from about 7.5 to about 9 or from about 8 to about 8.5). In one advantageous embodiment, the composition includes a pH buffer having a $pK_a$ in a range from about 7.5 to about 9 pH (e.g., from about 8 to about 8.5) and has a pH in a range from about 7.5 to about 9.5 (e.g., from about 8 to about 9).

In example embodiments in which the pH buffer has a $pK_a$ in a range from about 6 to about 9, the pH buffer may include, for example, citric acid, bis tris methane, tris (hydroxymethyl)aminomethane, tricine (tris glycine), diglycine, dipotassium hydrogen phosphate, triethanolamine, (4-(2-hydroxyethyl)-1-piperazineethanesulfonic acid) (HEPES), N-(2-Hydroxyethyl)piperazine-N'-(3-propanesulfonic acid) (HEPPS), diethanolamine, bicine, N-Tris(hydroxymethyOmethyl-3-aminopropanesulfonic acid (TAPS), N-Methyldiethanolamine, 2-amino-2-methyl-1,3-propanediol (AMPD), or mixtures thereof.

In preferred embodiments in which the pH buffer has a $pK_a$ in a range from about 7.5 to about 9, the pH buffer may include, for example, tris(hydroxymethyl)aminomethane, tricine (tris glycine), diglycine, triethanolamine, (4-(2-hydroxyethyl)-1-piperazineethanesulfonic acid) (HEPES), N-(2-Hydroxyethyl)piperazine-N'-(3-propanesulfonic acid) (HEPPS), diethanolamine, bicine, N-Tris(hydroxymethyl) methyl-3-aminopropanesulfonic acid (TAPS), N-Methyldiethanolamine, 2-amino-2-methyl-1,3-propanediol (AMPD), or mixtures thereof.

In most preferred embodiments in which the pH buffer has a $pK_a$ in a range from about 8 to about 8.5 the pH buffer may include, for example, tris(hydroxymethyl)aminomethane, tricine (tris glycine), or mixtures thereof. Tris(hydroxymethyl)aminomethane is the most preferred pH buffer.

Embodiments including a pH buffer generally include a sufficient quantity of the pH buffer to achieve a desired buffering capacity without overly inhibiting ruthenium removal. For example, the concentration of pH buffer in the polishing composition may be about 0.1 mM or more at point of use (e.g., about 0.2 mM or more, about 0.3 mM or more, about 0.5 mM or more, or about 1 mM or more). The concentration of pH buffer in the polishing composition may also be about 100 mM or less at point of use (e.g., about 50 mM or less, about 30 mM or less, about 20 mM or less, or about 10 mM or less). Accordingly, the point of use concentration of pH buffer in the polishing composition may be in a range bounded by any two of the above endpoints. For example, the point of use concentration of pH buffer in the polishing composition may be from about 0.1 mM to about 100 mM (e.g., from about 0.3 mM to about 30 mM, or from about 1 mM to about 10 mM). Selecting a suitable buffer concentration may require certain tradeoffs. For example, at higher concentrations the pH buffer may reduce the ruthenium polishing rate while at lower concentrations the buffering capacity may be insufficient to maintain the pH had a high enough value to inhibit pad staining.

The polishing composition may include one or more other optional compounds depending on the specific CMP operation. For example, the disclosed polishing composition may optionally further include an oxidizing agent. The oxidizing agent may be added to the polishing composition during the slurry manufacturing process or just prior to the CMP operation (e.g., in a tank located at the semiconductor fabrication facility). Preferred oxidizing agents include a peroxide compound. A peroxide compound is generally characterized as having the formula R—O—O—H wherein R is hydrogen or C1-C10 alkyl. Preferred peroxide compounds include hydrogen peroxide and tert-butyl hydroperoxide. A most preferred peroxide compound is hydrogen peroxide. When the peroxide compound is present, the polishing composition typically comprises about 0.1 wt. % or more (e.g., about 0.2 wt. % or more, or about 0.5 wt. % or more) of the peroxide compound. The polishing composition generally comprises about 10 wt. % or less (e.g., about 5 wt. % or less, or about 2 wt. % or less) of the peroxide compound. Accordingly, amount of peroxide in the polishing composition may be in a range bounded by any two of the above endpoints. For example, the amount of peroxide in the composition may be from about 0.1 wt. % to about 10 wt. % (e.g., from about 0.2 wt. % to about 5 wt. %, or from about 0.5 wt. % to about 2 wt. %).

The polishing composition optionally further includes other optional components such as corrosion/etch inhibitors, antifoaming agents, cationic, anionic, amphoteric, and/or nonionic polymers and/or surfactants, stabilizers, chelating agents, stopping agents, surfactants, and the like. It will be understood that the disclosed polishing compositions are expressly not limited in these regards.

The polishing composition may optionally further include a biocide. The biocide may include any suitable biocide, for example an isothiazolinone biocide. The amount of biocide in the polishing composition typically is in a range from about 1 ppm to about 50 ppm at point of use or in a concentrate, and preferably from about 1 ppm to about 20 ppm.

The polishing composition may be prepared using any suitable techniques, many of which are known to those skilled in the art. The polishing composition may be prepared in a batch or continuous process. Generally, the polishing composition may be prepared by combining the components thereof in any order. The term "component" as used herein includes the individual ingredients (e.g., the titanium oxide particles and the pH buffer).

For example, the titanium oxide particles may be dispersed in the aqueous liquid carrier. Other components may then be added and mixed by any method that is capable of incorporating the components into the polishing composition. For optional compositions including a peroxide compound, it will be understood that the peroxide compound may be added at any time during the preparation of the polishing composition. For example, the peroxide compound may be added just prior to the CMP operation (e.g., within about 1 minute, or within about 10 minutes, or within about 1 hour, or within about 1 day, or within about 1 week of the CMP operation). The polishing composition may also be prepared by mixing the components at the surface of the substrate (e.g., on the polishing pad) during the CMP operation.

The polishing composition of the invention may also be provided as a concentrate which is intended to be diluted with an appropriate amount of water prior to use. In such an embodiment, the polishing composition concentrate may include the titanium oxide particles and other optional components in amounts such that, upon dilution of the concentrate with an appropriate amount of water (and an optional peroxide compound if not already present in an appropriate amount), each component of the polishing composition will be present in the polishing composition at point of use in an amount within the appropriate range recited above for each component. For example, the titanium oxide particles may be present in the polishing composition in an amount that is about 2 times (e.g., about 3 times, about 4 times, about 5 times, or about 10 times) greater than the point of use concentration recited above for each component so that, when the concentrate is diluted with an equal volume of water (e.g., 1 equal volume of water, 2 equal volumes of water, 3 equal volumes of water, 4 equal volumes of water, or 9 equal volumes of water respectively), along with the optional oxidizing agent in a suitable amount, each component will be present in the polishing composition in an amount within the ranges set forth above for each component. Furthermore, as will be understood by those of ordinary skill in the art, the concentrate may contain an appropriate fraction of the water present in the final polishing composition in order to ensure that other components are at least partially or fully dissolved in the concentrate.

The polishing composition of the invention may be used to polish substantially any substrate including a metal layer and/or a dielectric layer. In certain embodiments, the polishing composition may be particularly useful for polishing a substrate comprising a ruthenium metal layer. A dielectric layer may be a metal oxide such as a silicon oxide layer derived from tetraethylorthosilicate (TEOS), porous metal oxide, porous or non-porous carbon doped silicon oxide, fluorine-doped silicon oxide, glass, organic polymer, fluorinated organic polymer, or any other suitable high or low-k insulating layer.

The polishing method of the invention is particularly suited for use in conjunction with a chemical mechanical polishing (CMP) apparatus. Typically, the apparatus includes a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition of the invention and then the polishing pad moving relative to the substrate, so as to abrade at least a portion of the substrate (such as ruthenium and/or a dielectric material as described herein) to polish the substrate.

A substrate can be planarized or polished with the chemical mechanical polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, co-formed products thereof, and mixtures thereof.

It will be understood that the disclosure includes numerous embodiments. These embodiments include, but are not limited to, the following embodiments.

In a first embodiment a chemical mechanical polishing composition may comprise, consist of, or consist essentially of a water based liquid carrier; titanium oxide particles dispersed in the liquid carrier, the titanium oxide particles including rutile and anatase such that an x-ray diffraction pattern of the titanium oxide particles has a ratio X:Y of about 0.05 to about 0.5, wherein X represents an intensity of a peak in the x-ray diffraction pattern having a d-spacing of about 3.24 Å and Y represents an intensity of a peak in the x-ray diffraction pattern having a d-spacing of about 3.51 Å; and a pH in a range from about 7 to about 10.

A second embodiment includes the first embodiment, wherein the pH is in a range from about 7.5 to about 9.5.

A third embodiment includes any one of the first through second embodiments, further comprising a pH buffer having a $pK_a$ in a range from about 6 to about 9.

A fourth embodiment includes any one of the first through third embodiments, comprising from about 0.05 wt. % to about 1 wt. % of the titanium oxide particles.

A fifth embodiment includes any one of the first through fourth embodiments, further comprising a peroxide compound.

A sixth embodiment includes a method for polishing a ruthenium containing substrate. The method comprises (a) contacting the substrate with any one of the polishing compositions of the first through fifth embodiments; (b) moving the polishing composition relative to the substrate; and (c) abrading the substrate to remove a portion of the ruthenium layer from the substrate and thereby polish the substrate.

In a seventh embodiment a chemical mechanical polishing composition may comprise, consist of, or consist essentially of a water based liquid carrier; titanium oxide particles dispersed in the liquid carrier, the titanium oxide particles including rutile and anatase such that an x-ray diffraction pattern of the titanium oxide particles has a ratio X:Y of greater than about 0.05, wherein X represents an intensity of a peak in the x-ray diffraction pattern having a d-spacing of about 3.24 Å and Y represents an intensity of a peak in the x-ray diffraction pattern having a d-spacing of about 3.51 Å; a pH in a range from about 7 to about 10; and a pH buffer having a $pK_a$ in a range from about 6 to about 9.

An eighth embodiment includes the seventh embodiment, wherein the pH buffer is selected from the group consisting of citric acid, bis tris methane, tris(hydroxymethyl)aminomethane, tricine (tris glycine), diglycine, dipotassium hydrogen phosphate, triethanolamine, (4-(2-hydroxyethyl)-1-piperazineethanesulfonic acid) (HEPES), N-(2-Hydroxyethyl)piperazine-N'-(3-propanesulfonic acid) (HEPPS), diethanolamine, bicine, N-Tris(hydroxymethyOmethyl-3-aminopropanesulfonic acid (TAPS), N-Methyldiethanolamine, 2-amino-2-methyl-1,3-propanediol (AMPD), and mixtures thereof.

A ninth embodiment includes the seventh embodiment wherein the pH buffer has a $pK_a$ in a range from about 7.5 to about 9.

A tenth embodiment includes the ninth embodiment wherein the pH buffer is selected from the group consisting of tris(hydroxymethyl)aminomethane, tricine (tris glycine), diglycine, triethanolamine, (4-(2-hydroxyethyl)-1-piperazineethanesulfonic acid) (HEPES), N-(2-Hydroxyethyl)piperazine-N'-(3-propanesulfonic acid) (HEPPS), diethanolamine, bicine, N-Tris(hydroxymethyl)methyl-3-aminopropanesulfonic acid (TAPS), N-Methyldiethanolamine, 2-amino-2-methyl-1,3-propanediol (AMPD), and mixtures thereof.

An eleventh embodiment includes the seventh embodiment wherein the pH buffer has a $pK_a$ in a range from about 8.0 to about 8.5.

A twelfth embodiment includes any one of the seventh through eleventh embodiments wherein the pH buffer is tris(hydroxymethyl)aminomethane.

A thirteenth embodiment includes any one of the seventh through twelfth embodiments wherein the pH is in a range from about 7.5 to about 9.5.

A fourteenth embodiment includes any one of the seventh through thirteenth embodiments comprising from about 0.05 wt. % to about 1 wt. % of the titanium oxide particles.

A fifteenth embodiment includes any one of the seventh through fourteenth embodiments wherein a concentration of the pH buffer is in a range from about 0.3 mM to about 30 mM.

A sixteenth embodiment includes any one of the seventh through fifteenth embodiments wherein the pH is in a range from about 7.5 to about 9.5 and the pH buffer has a $pK_a$ in a range from about 7.5 to about 9.

A seventeenth embodiment includes any one of the seventh through sixteenth embodiments wherein the titanium oxide particles have a ratio X:Y of greater than about 1.

An eighteenth embodiment includes any one of the seventh through sixteenth embodiments wherein the titanium oxide particles have a ratio X:Y of greater than about 10.

An nineteenth embodiment includes any one of the seventh through sixteenth embodiments wherein the titanium oxide is substantially pure rutile.

A twentieth embodiment includes a method for polishing a ruthenium containing substrate. The method comprises: (a) contacting the substrate with any one of the polishing compositions of the seventh through nineteenth embodiments; (b) moving the polishing composition relative to the substrate; and (c) abrading the substrate to remove a portion of the ruthenium layer from the substrate and thereby polish the substrate.

A twenty-first embodiment includes the twentieth embodiment wherein: said moving in (b) comprises moving the polishing composition relative to the substrate and a polishing pad and said abrading in (c) does not stain the polishing pad.

Example 1

Five titanium oxide containing compositions were prepared and evaluated using x-ray diffraction. The titanium oxide particles in composition 1A included about 100 percent rutile. The titanium oxide particles in composition 1B included about 100 percent anatase. Compositions 1A and 1B included blends of the 1A and 1B particles and were blended to obtain compositions 1C, 1D, and 1E including about 25% rutile and 75% anatase (1C), about 50% rutile and 50% anatase (1D) and about 75% rutile and 25% anatase (1E).

Samples from each of compositions 1A-1E were centrifuged and dried to obtain titanium oxide powder samples. The powder samples were evaluated using x-ray diffraction. Rutile and anatase exhibit x-ray diffraction patterns having distinct peaks. The ratio of the intensity of the peaks (i.e., lines) in titanium oxide powders obtained from compositions 1A-1E were evaluated in this example. The FIGURE depicts example x-ray diffraction curves. As depicted, rutile includes a characteristic x-ray diffraction line at a d-spacing of about 3.24 Å and anatase includes a characteristic x-ray diffraction line at a d-spacing of about 3.51 Å. Table 1 lists X/Y ratios for the titanium oxide powders obtained from compositions 1A-1E wherein X represents an intensity of a peak in the x-ray diffraction pattern having a d-spacing of about 3.24 Å and Y represents an intensity of a peak in the x-ray diffraction pattern having a d-spacing of about 3.51 Å. The peak intensity values were obtained by subtracting the background x-ray counts from the peak maximum.

TABLE 1

| Composition | Rutile (wt. %) | Anatase (wt. %) | X:Y Ratio |
|---|---|---|---|
| 1A | 100% | 0% | 25 |
| 1B | 0 | 100% | 0 |
| 1C | 25 | 75 | 0.1 |
| 1D | 50 | 50 | 0.4 |
| 1E | 75 | 25 | 1.1 |

As is evident from the data set forth in Table 1 and the FIGURE, the X:Y ratio increases with increasing rutile content, from a value of about zero to a value of about 1 for a composition having about 75 percent rutile.

Example 2

Eighteen polishing compositions were evaluated. Each of the compositions included 0.2 weight percent titanium oxide and 1.0 weight percent hydrogen peroxide at pH values of 3, 5, 8.5, or 10 as indicated in Table 2. Six distinct titanium oxides were evaluated. Compositions 2A-2D included the same titanium oxide as composition 1A in Example 1 having an X:Y ratio of 25. Composition 2E included a composition having titanium oxide with mixed rutile and anatase having an X:Y ratio of 5.4. Composition 2F included a composition having titanium oxide with mixed rutile and anatase having an X:Y ratio of 1.6. Compositions 2G-2I included a composition having titanium oxide with mixed rutile and anatase having an X:Y ratio of about 0.14. Compositions 2J-2L included a composition having titanium oxide with mixed rutile and anatase having an X:Y ratio of about 0.09. Compositions 2M-2O included a composition having titanium oxide with mixed rutile and anatase having an X:Y ratio of about 0.08. Compositions 2P-2R included a composition having titanium oxide abrasive with anatase having an X:Y ratio of about 0.

Compositions 2A-2R were evaluated by polishing ruthenium blanket wafers (available from Advantiv) using a POLI500 polishing tool (available from G&P Technology). The wafers had a diameter of 200 mm and a ruthenium film thickness of 3000 Å. The wafers were polished on an M2000 polishing pad (available from Cabot Microelectronics) at a down force of 1.5 psi, a platen speed of 93 rpm, a head speed of 87 rpm, and a slurry flow rate of 70 mL/min. The pad was conditioned ex-situ (between wafers) using a 3M-A165 conditioner at a downforce of 9 lbs. and conditioning speed of 101 rpm.

The titanium oxide X:Y ratios, the pH of the composition, and the ruthenium removal rate obtained for each compositions are set forth in Table 2.

TABLE 2

| Composition | X:Y | pH | Removal Rate (Å/min) |
|---|---|---|---|
| 2A | 25 | 3 | 407 |
| 2B | 25 | 5 | 341 |
| 2C | 25 | 8.5 | 298 |
| 2D | 25 | 10 | 171 |
| 2E | 5.4 | 8.5 | 284 |
| 2F | 1.6 | 8.5 | 204 |
| 2G | 0.14 | 5 | 270 |
| 2H | 0.14 | 8.5 | 18 |
| 2I | 0.14 | 10 | 15 |
| 2J | 0.09 | 5 | 145 |
| 2K | 0.09 | 8.5 | 19 |
| 2L | 0.09 | 10 | 12 |
| 2M | 0.08 | 5 | 256 |
| 2N | 0.08 | 8.5 | 216 |
| 2O | 0.08 | 10 | 9 |
| 2P | 0 | 5 | 5 |
| 2Q | 0 | 8.5 | 5 |
| 2R | 0 | 10 | 16 |

As is readily apparent from the results set forth in Table 2, the ruthenium removal rate decreases with increasing pH. Moreover, inventive composition 2N, having an X:Y ratio of 0.08 and a pH of 8.5 was observed to have a high ruthenium removal rate.

Example 3

Fifteen polishing compositions were tested to evaluate the effect of various pH buffers on pad staining. Each composition included 0.2 weight percent of the titanium oxide used in composition 1A in Example 1 and composition 2C in Example 2 having an X:Y ratio of 25 and 1.0 weight percent hydrogen peroxide at an initial pH of 8.5. The compositions further included 3 mM (0.003M) of a pH buffer. The pH buffers are listed in Table 3.

The polishing compositions were evaluated using a lab-scale testing apparatus in which a 2 cm diameter M2000 pad sample (available from Cabot Microelectronics) was rotated against a ruthenium disk submerged in 30 grams of the polishing composition. The pad was rotated at 400 rpm at a downforce of 3 psi for 120 seconds. After completion of the experiment, the pad was removed from the polishing composition and visually examined for pad staining. The final pH of the remaining polishing composition was measured (after the completion of the pad staining test). The results of the pad staining experiment are set forth in Table 3.

TABLE 3

| Composition | pH Buffer | Buffer $pK_a$ | Final pH | Pad Staining |
|---|---|---|---|---|
| 3A | None | NA | 6.8 | Dark |
| 3B | Oxalic Acid | 4.3 | 6.7 | Dark |
| 3C | Dehydroacetic Acid | 5.1 | 6.3 | Dark |
| 3D | Citric Acid | 6.4 | 7.5 | Dim |
| 3E | Bis Tris Methane | 6.5 | 7.9 | Dim |
| 3F | (4-(2-hydroxyethyl)-1-piperazineethanesulfonic acid) | 7.6 | 8.2 | Dim |
| 3G | Triethanolamine | 7.8 | 8.2 | Dim |
| 3H | N-(2-Hydroxyethyl)piperazine-N'-(3-propanesulfonic acid) | 8.0 | 8.2 | Dim |
| 3I | Tris(hydroxymethyl)aminomethane | 8.1 | 8.4 | None |
| 3J | Tricine | 8.2 | 8.3 | None |
| 3K | Diethanolamine | 8.9 | 8.2 | Dim |
| 3L | Glycine | 9.8 | 7.4 | Dark |

TABLE 3-continued

| Composition | pH Buffer | Buffer $pK_a$ | Final pH | Pad Staining |
|---|---|---|---|---|
| 3M | Tetrabutylammonium hydroxide | ~10 | 7.2 | Dark |
| 3N | Tetraethylammonium hydroxide | 10.8 | 7.1 | Dark |
| 3O | Choline | 13.9 | 7.2 | Dark |

As is readily apparent from the data set forth in Table 3, the compositions including a pH buffer having a $pK_a$ in a range from about 6 to about 9 (3D-3K) had significantly reduced pad staining as compared to the control composition (3A). Moreover compositions 3I and 3J including a pH buffer having a $pK_a$ in a range from about 8 to about 8.5 had no pad staining.

Example 4

Three polishing compositions were further evaluated for pad staining. Composition 4A was identical to composition 2A. Composition 4B was identical to composition 2C. Composition 4C included 0.3 weight percent of the same titanium oxide used in compositions 4A and 4B, 0.05 weight percent (500 ppm by weight) (4.1 mM) Tris(hydroxymethyl) aminomethane pH buffer, and 1 weight percent hydrogen peroxide at a pH of 8.5 (adjusted using nitric acid).

Ruthenium blanket wafers (the same wafers as described above in Example 2) were polished using a POLI500 polishing tool (available from G&P Technology). All wafers were polished on an M2000 polishing pad (available from Cabot Microelectronics) at a platen speed of 93 rpm, a head speed of 87 rpm, and a slurry flow rate of 70 mL/min. A new pad was used for each composition. The pad was conditioned for 30 minutes for break in and 3 minutes between every other wafer using a 3M-A165 conditioner at a downforce of 9 lbs. and conditioning speed of 101 rpm. Compositions 4A and 4B were polished at a downforce of 1.5 psi. Composition 4C was polished at a downforce of 2.3 psi.

The polishing pad was examined visually for pad staining. Only 1 wafer was polished using composition 4A. Dark pad staining was observed.

Twelve wafers were polished using composition 4B. Moderate pad staining was observed. The average ruthenium removal rate was 354 Å/min.

Twenty-two wafers were polished using composition 4C. No pad staining was observed. The average ruthenium removal rate was 352 Å/min.

As is readily apparent, pad staining was significantly reduced by increasing the pH from 3 to 8.5 (comparing 4A to 4B) and can be completely eliminated (even at higher downforces) using an appropriate buffer (comparing 4B to 4C).

Example 5

Eight polishing compositions were tested to evaluate the effect of pH buffer on ruthenium polishing rates. Each composition included 0.2 weight percent of the titanium oxide described above in composition 1A (Example 1) and 1 weight percent hydrogen peroxide at a pH of 8.5 (adjusted using nitric acid). Composition 5A included no pH buffer. Compositions 5B through 5H included 0.005 M (5 mM) pH buffer. The pH buffers and their corresponding $pK_a$ values are listed in Table 5.

Compositions 5A-5H were evaluated by polishing ruthenium blanket wafers (available from Advantiv) using a POLI500 polishing tool (available from G&P Technology) as described above in Example 2. The wafers had a diameter of 200 mm and a ruthenium film thickness of 3000 Å. The wafers were polished on an M2000 polishing pad (available from Cabot Microelectronics) at a down force of 1.5 psi, a platen speed of 93 rpm, a head speed of 87 rpm, and a slurry flow rate of 70 mL/min. The pad was conditioned ex-situ (between wafers) using a 3M-A165 conditioner at a downforce of 9 lbs. and conditioning speed of 101 rpm. Ruthenium removal rates are listed in Table 5.

TABLE 5

| Composition | pH Buffer | Buffer $pK_a$ | Removal Rate (Å/min) |
|---|---|---|---|
| 5A | None | NA | 364 |
| 5B | Dipotassium hydrogen phosphate | 7.2 | 94 |
| 5C | N-(2-Hydroxyethyl)piperazine-N'-(3-propanesulfonic acid) | 8.0 | 80 |
| 5D | Tris(hydroxymethyl)aminomethane | 8.1 | 98 |
| 5E | Tricine | 8.2 | 90 |
| 5F | Diglycine | 8.2 | 80 |
| 5G | Bicine | 8.3 | 32 |
| 5H | ([tris(hydroxymethyl)methylamino] propanesulfonic acid) | 8.4 | 62 |

As is readily apparent from the data set forth in Table 5, the ruthenium polishing rate decreases with the addition of a pH buffer. Compositions 5D was found to have the highest polishing rate among the buffered compositions. Compositions 3I (Example 3) and 4C (Example 4) included the same pH buffer and exhibited no pad staining.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical mechanical polishing composition comprising:
   a water based liquid carrier;
   titanium oxide particles dispersed in the liquid carrier, the titanium oxide particles including rutile and anatase such that an x-ray diffraction pattern of the titanium oxide particles has a ratio X:Y of about 0.05 to about 0.5, wherein X represents an intensity of a peak in the x-ray diffraction pattern having a d-spacing of about 3.24 Å and Y represents an intensity of a peak in the x-ray diffraction pattern having a d-spacing of about 3.51 Å; and
   a pH in a range from about 7 to about 10.

2. The composition of claim 1, wherein the pH is in a range from about 7.5 to about 9.5.

3. The composition of claim 1, further comprising a pH buffer having a $pK_a$ in a range from about 6 to about 9.

4. The composition of claim 1, comprising from about 0.05 wt. % to about 1 wt. % of the titanium oxide particles.

5. The composition of claim 1, further comprising a peroxide compound.

6. A method for polishing a ruthenium containing substrate, the method comprising:
   (a) contacting the substrate with the polishing composition of claim 1;
   (b) moving the polishing composition relative to the substrate; and
   (c) abrading the substrate to remove a portion of the ruthenium layer from the substrate and thereby polish the substrate.

7. A chemical mechanical polishing composition comprising:
   a water based liquid carrier;
   titanium oxide particles dispersed in the liquid carrier, the titanium oxide particles including rutile and anatase such that an x-ray diffraction pattern of the titanium oxide particles has a ratio X:Y of greater than about 0.05, wherein X represents an intensity of a peak in the x-ray diffraction pattern having a d-spacing of about 3.24 Å and Y represents an intensity of a peak in the x-ray diffraction pattern having a d-spacing of about 3.51 Å;
   a pH in a range from about 7 to about 10; and
   a pH buffer having a $pK_a$ in a range from about 6 to about 9.

8. The composition of claim 7, wherein the pH buffer is selected from the group consisting of citric acid, bis tris methane, tris(hydroxymethyl)aminomethane, tricine (tris glycine), diglycine, dipotassium hydrogen phosphate, triethanolamine, (4-(2-hydroxyethyl)-1-piperazineethanesulfonic acid) (HEPES), N-(2-Hydroxyethyl)piperazine-N'-(3-propanesulfonic acid) (HEPPS), diethanolamine, bicine, N-Tris(hydroxymethyl)methyl-3-aminopropanesulfonic acid (TAPS), N-Methyldiethanolamine, 2-amino-2-methyl-1,3-propanediol (AMPD), and mixtures thereof.

9. The composition of claim 7, wherein the pH buffer has a $pK_a$ in a range from about 7.5 to about 9.

10. The composition of claim 9, wherein the pH buffer is selected from the group consisting of tris(hydroxymethyl)aminomethane, tricine (tris glycine), diglycine, triethanolamine, (4-(2-hydroxyethyl)-1-piperazineethanesulfonic acid) (HEPES), N-(2-Hydroxyethyl)piperazine-N'-(3-propanesulfonic acid) (HEPPS), diethanolamine, bicine, N-Tris(hydroxymethyOmethyl-3-aminopropanesulfonic acid (TAPS), N-Methyldiethanolamine, 2-amino-2-methyl-1,3-propanediol (AMPD), and mixtures thereof.

11. The composition of claim 7, wherein the pH buffer has a $pK_a$ in a range from about 8.0 to about 8.5.

12. The composition of claim 7 wherein the pH buffer is tris(hydroxymethyl)aminomethane.

13. The composition of claim 7, wherein the pH is in a range from about 7.5 to about 9.5.

14. The composition of claim 7, comprising from about 0.05 wt. % to about 1 wt. % of the titanium oxide particles.

15. The composition of claim 7, wherein a concentration of the pH buffer is in a range from about 0.3 mM to about 30 mM.

16. The composition of claim 7, wherein the pH is in a range from about 7.5 to about 9.5 and the pH buffer has a $pK_a$ in a range from about 7.5 to about 9.

17. The composition of claim 7, wherein the titanium oxide particles have a ratio X:Y of greater than about 1.

18. The composition of claim 7, wherein the titanium oxide particles have a ratio X:Y of greater than about 10.

19. The composition of claim 7, wherein the titanium oxide is substantially pure rutile.

20. A method for polishing a ruthenium containing substrate, the method comprising:
   (a) contacting the substrate with the polishing composition of claim 7;
   (b) moving the polishing composition relative to the substrate; and
   (c) abrading the substrate to remove a portion of the ruthenium layer from the substrate and thereby polish the substrate.

21. The method of claim 20, wherein:
   said moving in (b) comprises moving the polishing composition relative to the substrate and a polishing pad; and
   said abrading in (c) does not stain the polishing pad.

* * * * *